(12) United States Patent
Shi et al.

(10) Patent No.: US 8,093,786 B2
(45) Date of Patent: Jan. 10, 2012

(54) PIEZOELECTRIC COMPOSITE NANOFIBERS, NANOTUBES, NANOJUNCTIONS AND NANOTREES

(75) Inventors: Yong Shi, Nutley, NJ (US); Shiyou Xu, Harrison, NJ (US)

(73) Assignee: The Trustees of the Stevens Institute of Technology, Hoboken, NJ (US)

( * ) Notice: Subject to any disclaimer, the term of this patent is extended or adjusted under 35 U.S.C. 154(b) by 29 days.

(21) Appl. No.: 12/806,969

(22) Filed: Aug. 25, 2010

(65) Prior Publication Data

US 2011/0210650 A1 Sep. 1, 2011

Related U.S. Application Data

(62) Division of application No. 12/229,192, filed on Aug. 20, 2008, now abandoned.

(60) Provisional application No. 60/957,034, filed on Aug. 21, 2007.

(51) Int. Cl.
*H01L 41/09* (2006.01)
*H01L 41/22* (2006.01)
*B05D 5/12* (2006.01)

(52) U.S. Cl. ....... 310/367; 310/311; 310/370; 29/25.35; 427/100; 427/126.3

(58) Field of Classification Search .................. 310/311, 310/367, 370; 29/25.35; 427/100, 126, 3
See application file for complete search history.

(56) References Cited

U.S. PATENT DOCUMENTS

| | | | |
|---|---|---|---|
| 6,247,799 | B1 | 6/2001 | Sakamaki et al. |
| 7,147,834 | B2 | 12/2006 | Wong et al. |
| 2009/0056094 | A1 | 3/2009 | Shi et al. |

FOREIGN PATENT DOCUMENTS

EP 1439546 A1 7/2004

OTHER PUBLICATIONS

Non-Final Office Action for U.S. Appl. No. 12/229,192, mailed Oct. 7, 2010.
Shaislamov, U.A., et al., "Fabrication of PZT Tubular Structures by a Template-wetting Process," Journal of the Korean Ceramic Society, vol. 44, No. 5 (2007), pp. 141-143.
Luo, Yun, et al., "Nanoshell tubes of ferroelectric lead zirconate titanate and barium titanate," Applied Physics Letters, vol. 83, No. 3 (2003), pp. 440-442.
Min, Hyung-Seob, et al., "Ferroelectric Nanotubes Array Growth in Anodic Porous Alumina Nanoholes on Silicons," Ferroelectric 336 (2006), pp. 231-235.
U.S. Appl. No. 12/806,981, filed Aug. 25, 2010, entitled "Piezoelectric Composite Nanofibers, Nanotubes, Nanojunctions and Nanotrees."

*Primary Examiner* — Thomas Dougherty
(74) *Attorney, Agent, or Firm* — Greenberg Traurig, LLP

(57) ABSTRACT

Piezoelectric nanostructures, including nanofibers, nanotubes, nanojunctions and nanotrees, may be made of piezoelectric materials alone, or as composites of piezoelectric materials and electrically-conductive materials. Homogeneous or composite nanofibers and nanotubes may be fabricated by electrospinning. Homogeneous or composite nanotubes, nanojunctions and nanotrees may be fabricated by template-assisted processes in which colloidal suspensions and/or modified sol-gels of the desired materials are deposited sequentially into the pores of a template. The electrospinning or template-assisted fabrication methods may employ a modified sol-gel process for obtaining a perovskite phase in the piezoelectric material at a low annealing temperature.

16 Claims, 15 Drawing Sheets

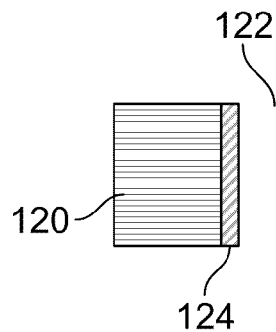 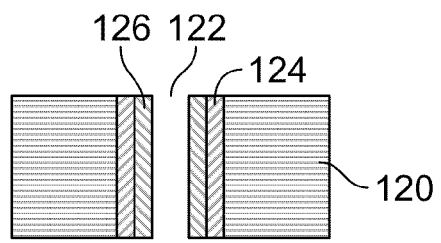
FIG. 13a    FIG. 13b
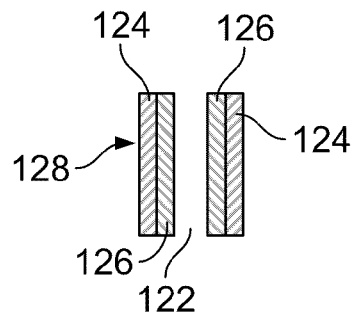
FIG. 13c
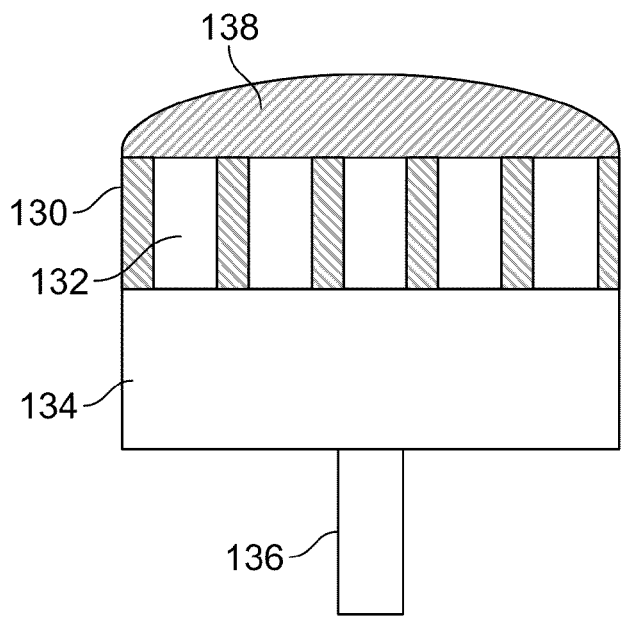
FIG. 14

PIEZOELECTRIC COMPOSITE NANOFIBERS, NANOTUBES, NANOJUNCTIONS AND NANOTREES

CROSS-REFERENCE TO RELATED APPLICATIONS

The present application is a divisional application of prior U.S. application Ser. No. 12/229,192, filed on Aug. 20, 2008, now abandoned, which claims priority of U.S. Patent Application Ser. No. 60/957,034, filed Aug. 21, 2007, the entirety of which is incorporated herein by reference.

STATEMENT REGARDING FEDERALLY SPONSORED RESEARCH

Some of the research performed in the development of the disclosed subject matter was supported by grant CMMI #0826418 from the National Science Foundation. The U.S. government may have certain rights with respect to this application.

FIELD OF THE INVENTION

The present invention relates to piezoelectric nanostructures, including highly-branched nanostructures ("nanotrees"), and variations of the aforesaid having multiple layers and/or electrically-conductive features, and methods for fabrication of such nanostructures.

BACKGROUND OF THE INVENTION

Piezoelectric materials have been utilized widely in sensors and actuators. Compared to commonly used piezoelectric structures, such as those based on bulk and thin films, piezoelectric fibers have attracted more attention because they allow greater flexibility in the design and application of various structures. Such fibers can be made of a number of materials, such as zinc oxide (ZnO), barium titanate (BaTiO$_3$), lead zirconate titanate (PbZr$_{1-x}$Ti$_x$O$_3$, PZT) or a piezoelectric polymer such as polyvinylidine fluoride (PVDF). In particular, fibers made of PZT have provided the basis for devices having high bandwidth, fast response, and high sensitivity.

While there are many methods for fabricating piezoelectric fibers having microscale dimensions, there are few methods for fabricating piezoelectric nanofibers (i.e., fibers having dimensions on the order of nanometers), including hydrothermal synthesis, sol electrophoresis and metallo-organic decomposition (MOD) electrospinning. Fibers fabricated by the hydrothermal and electrophoretic methods are discontinuous, which limits their usefulness as components of working devices. In contrast, the electrospinning method can fabricate continuous fibers having diameters from tens to hundreds of nanometers. Further, aligned fibers can be fabricated using simple auxiliary methods.

Piezoelectric fibers, in general, have been used in active fiber composites (AFC) as sensors and actuators. AFC typically comprise piezoelectric fibers in a polymer matrix, and are more flexible and robust than monolithic piezoelectric devices because they combine the physical properties of the fibers and the matrix. Devices known in the prior art have used fibers with diameters as small as 30 microns, but such fibers are too large to be embedded in active structures or micro or nanoscale devices. Further, AFC typically incorporate interdigitated electrodes to simplify fabrication and take advantage of the non-isotropic character of the piezoelectric properties of the fiber.

SUMMARY OF THE INVENTION

In one aspect, the subject matter disclosed herein is directed to the fabrication of piezoelectric structures having nanoscale dimensions, and the characteristics and uses of the nanostructures themselves. Fibrous structures ("nanofibers"), tubular structures ("nanotubes"), simple branched structures ("nanojunctions") and highly-branched structures ("nanotrees") are disclosed. The disclosed nanostructures include structures that are fabricated entirely from piezoelectric materials. The disclosed nanostructures further include composite nanostructures which comprise adjacent layers of piezoelectric materials and electrically-conductive materials. Such composite nanostructures may act as mechanical-electrical energy transducers and as electrical conductors or electrodes.

In another aspect, the subject matter disclosed herein is directed to methods for fabricating homogeneous or composite nanofibers and nanotubes by electrospinning. The disclosed methods may employ a modified sol-gel process for obtaining a perovskite phase at a low annealing temperature, which is also disclosed herein. The disclosed methods also present methods and devices for aligning the nanofibers and nanotubes as they are collected. Devices are disclosed for fabricating single homogeneous nanofibers and for fabricating multiple nanofibers at high rates. Further, a co-axial device for electrospinning composite nanofibers and nanotubes, or homogeneous nanotubes, is disclosed.

In yet another aspect, the subject matter disclosed herein is directed to template-assisted methods for fabricating nanotubes, nanotubes and nanotrees, as homogeneous structures of piezoelectric materials or composite structures of piezoelectric materials and electrically-conductive materials. In the disclosed methods, a template having pores of the desired configuration (i.e., straight pores to fabricate nanotubes, simple branched pores to fabricate nanojunctions, or highly-branched pores to fabricate nanotrees) are selected or fabricated, and modified sol-gels or colloidal suspensions of piezoelectric materials or electrically-conductive materials are deposited, sequentially, into the pores to build-up the desired nanostructure. The nanostructures may be solidified or annealed during or after the build-up process. The disclosed template-assisted fabrication methods may also employ the modified sol-gel process that was discussed with respect to the disclosure of electrospinning methods.

In a further aspect, the subject matter disclosed herein is directed to micron-scale active fiber composite devices comprising piezoelectric nanostructures (NAFC), and methods for fabricating such devices. Such devices comprise piezoelectric nanostructures that are in direct contact with electrodes and encased in a dielectric matrix material. Such devices may, in an alternative, include composite piezoelectric nanostructures, which may eliminate the need to provide separate electrodes in the NAFC.

BRIEF DESCRIPTION OF THE DRAWINGS

For a better understanding of the present invention, reference is made to the following detailed description of the exemplary embodiments considered in conjunction with the accompanying drawings, in which:

FIGS. 13a-13c are schematic drawings representing steps in a template-assisted fabrication of a composite nanotube.

FIG. 14 is a schematic drawing of a set-up for vacuum-assisted fabrication of a nanotube.

DETAILED DESCRIPTION OF THE INVENTION

Fabrication of PZT Nanofibers by Electrospinning Sol-Gel Precursors

As discussed herein, the fabrication of piezoelectric nanofibers (e.g. fibers having diameters with range of tens to hundreds of nanometers) by electrospinning sol-gel precursors and annealing the collected fibers at low temperatures is a promising technique for fabricating ceramic nanofibers, and other ceramic nanostructures, having excellent mechanical and piezoelectric properties. Nanofibers fabricated by such methods may be actuated in either transverse mode or longitudinal mode, which provides more flexibility in designing the devices and systems in which they are used. Such nanofibers may be used directly as sensors or as actuators in microscale or nanoscale devices. With appropriate surface functionalization, nanofiber resonators could be used as biosensors. Further, such nanofibers may be used as active structures in applications for which thin films could not be used. Nanotubes (i.e., hollow tubes having diameters in the same range as nanofibers) having properties and uses comparable to the aforesaid nanofibers may be fabricated by a modified electrospinning process using a specially-designed device discussed separately herein.

As an example of nanofiber fabrication, lead zirconate titanate (PZT) nanofibers (specifically, nanofibers formed from $PbZr_{52}Ti_{48}O_3$) were prepared by an electrospinning process and tested to determine their structures and properties. The primary component of the precursor mixture was a commercial PZT sol-gel (MMC Electronics America Inc.). Several materials were used to modify the viscosity and conductivity of the PZT sol-gel, from which polyvinyl pyrrolidine) (PVP) was selected for further use. The PZT sol-gel was mixed with a solution of PVP in alcohol, and acetic acid was added to stabilize the solution and to control hydrolysis of the sol-gel. The amount of PVP was varied to control the diameter of the nanofibers. The compositions of the precursor mixtures tested were as follows:

| | |
|---|---|
| PZT sol-gel: | 3 ml |
| PVP: | variable, but on the order of 0.1 to several grams |
| Alcohol: | 5 ml |
| Acetic acid: | 2 ml |

It was observed that the diameters of nanofibers fabricated by electrospinning could be controlled by adjusting the amount of PVP in the precursor mixture. Continuous nanofibers having an average diameter of about 50 nm were obtained at a PVP concentration of roughly 0.007 g PVP/ml of precursor mixture. The average diameter of the continuous nanofibers was increased to about 150 nm by adjusting the PVP concentration upward to roughly 0.028 g PVP/ml of precursor mixture. At PVP concentrations above 0.028 g/ml, the diameters of the nanofibers decreased gradually until continuous fibers could no longer be collected, probably due to the loss of PVP during the annealing process.

Figure 1:
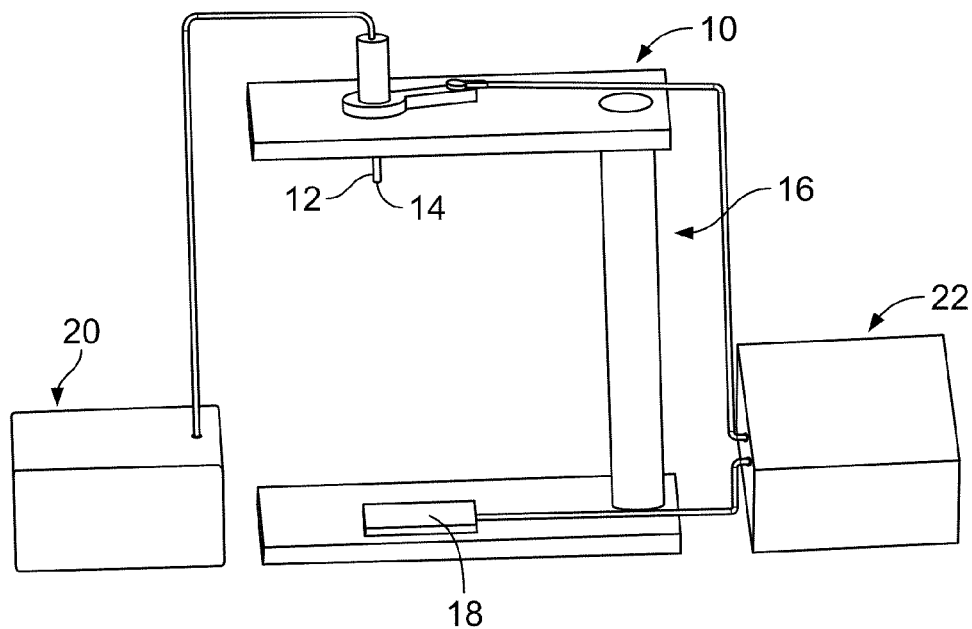
FIG. 1 is a schematic diagram of a single-needle electrospinning apparatus used to fabricate homogeneous piezoelectric nanofibers.

FIG. 1 is a schematic drawing of the electrospinning apparatus 10 used to fabricate nanofibers for testing. The apparatus 10 includes a stainless steel needle 12, which has an opening 14 with a diameter of about 200 microns, and which is mounted on a frame 16 over a collecting substrate 18. It is preferable to use a wafer of high-resistance silicon or a high-dielectric material such as alumina or silica as the substrate 18. Parallel electrodes or interdigitated electrodes (not shown) may be deposited on the substrate by any of a number of known methods to aid in aligning the nanofibers. Nanofibers collected for mechanical testing in the present example were collected across 5 micron trenches etched into the substrate.

In the electrospinning process, a feeding system 20, which includes a high-pressure pump (not shown) and syringe (not shown) containing the precursor mixture, was used to provide a continuous supply of precursor mixture to the needle 12. A high-voltage power source 22 was used to apply a voltage across the needle 12 and the substrate 18. The high-pressure pump applied pressure to the syringe to maintain a flow range of about 0.5 μl/min, which was sufficient to maintain a small drop of the precursor mixture at the needle tip in the absence of a voltage across the needle 12 and the substrate 18. A high voltage (in this instance, 10,000 V) was then applied across the needle 12 and substrate 18. The high voltage overcame the surface tension of drop at the tip of the needle, producing a highly-charged jet of the precursor mixture. The jet underwent a stretching and whipping process during which the solvent in the precursor mixture evaporated and nanoscale fibers were deposited on the collecting substrate.

The collected as-spun fibers (also, "green fibers") were cured in a three-step process. First, the fibers were solidified at 80° C. for 5 minutes, then held at 380° C. for 5 minutes to drive off solvent. Finally, the nanofibers were heated at 650° C. for 1 hour to create a pure perovskite phase, in which phase PZT and other ceramic compounds have piezoelectric properties. This temperature is lower than that needed to anneal nanofibers made from metal-organic precursors, possibly because of the precursor mixture that was used.

Annealed nanofibers fabricated as described above may be released from the substrate by any of a number of known dry etching methods, depending on the substrate which is used. In instances where a nanofiber is laid across a trench in a substrate, such release may not be required.

Test Results for PZT Nanofibers Fabricated by Electrospinning

Figure 2:
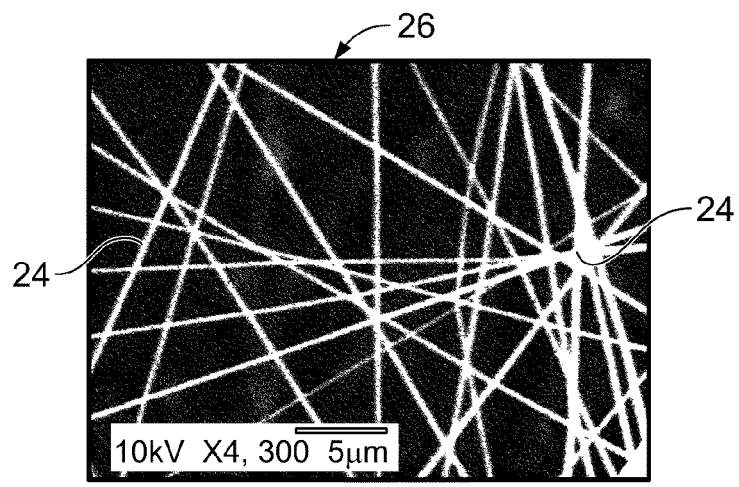
FIG. 2 is a scanning electron microscopy (SEM) image of randomly distributed piezoelectric nanofibers collected on a substrate.
Figure 3:
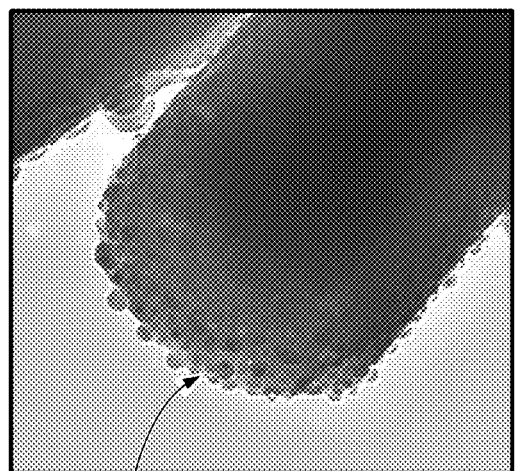
FIG. 3 is a transmission electron microscopy (TEM) image of an annealed piezoelectric nanofiber.

Characterization: Nanofibers fabricated as described above were characterized by scanning electron microscopy (SEM), transmission electron microscopy (TEM) and X-ray diffraction. FIG. 2 is a SEM image of a collection of randomly distributed PZT nanofibers 24 on a silicon substrate 26. Aligned nanofibers were obtained using pre-patterned electrodes, such as those described above. FIG. 3 is a TEM image of a PZT nanofiber 28 having a diameter of about 150 nm.

Figure 5:
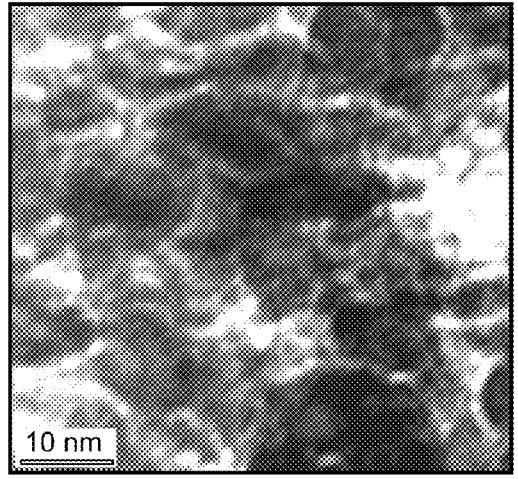
FIG. 5 is a TEM image of an annealed PZT nanofiber showing crystalline structures.
Figure 4:
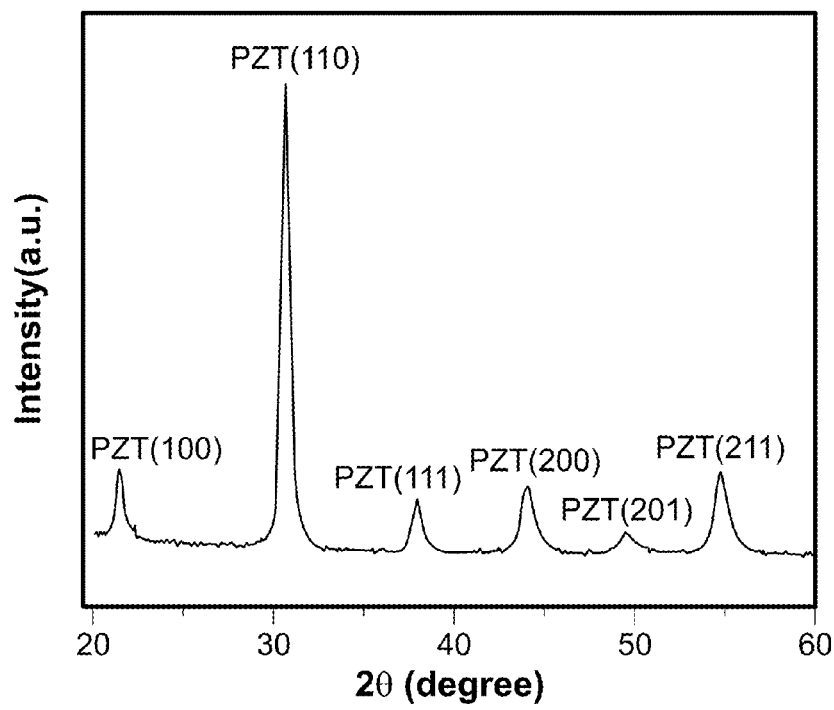
FIG. 4 is an x-ray diffraction pattern of an annealed nanofiber fabricated from a modified lead zirconate titanate (PZT) sol-gel.

FIG. 4 shows the x-ray diffraction pattern of the annealed PZT nanofibers. The pattern indicates that the nanofibers have a pure perovskite crystalline phase, which provides the piezoelectric properties of the nanofibers. FIG. 5 is a TEM image of an annealed PZT nanofiber and shows that the crystalline grain sizes are about 10 nm.

Figure 6:
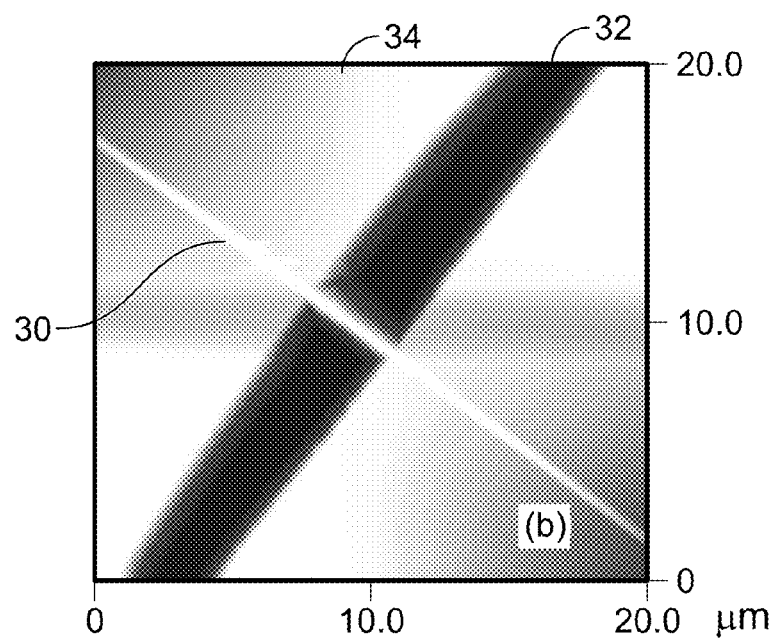
FIG. 6 is a SEM image of a PZT nanofiber collected across a trench etched into a silicon substrate.
Figure 7:
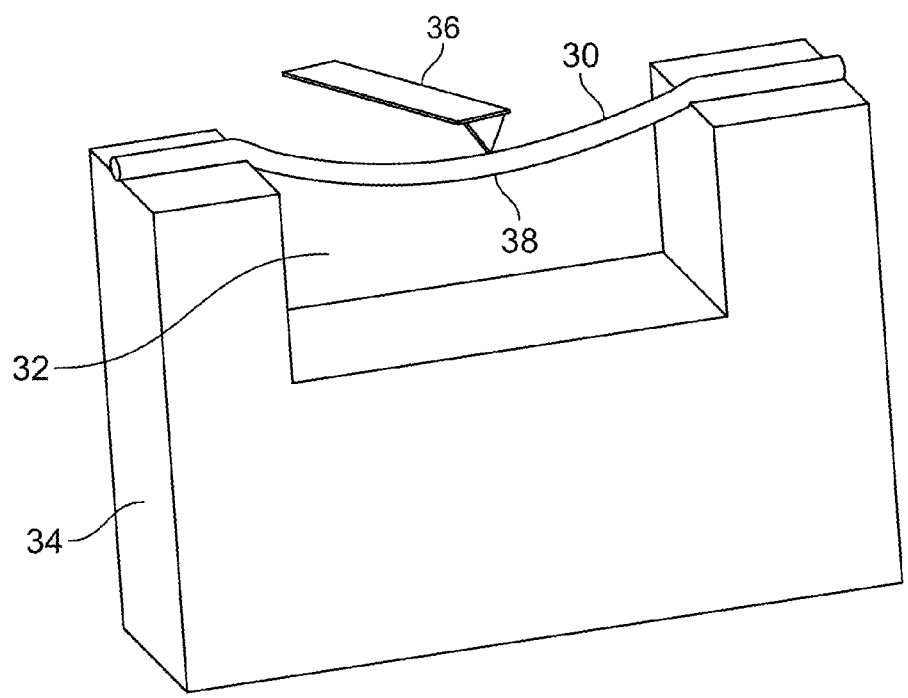
FIG. 7 is a schematic diagram of a three-point bending test performed on the PZT nanofiber of FIG. 6 using an atomic force microscope (AFM).

Mechanical properties: The Young's modulus of a single nanofiber was determined using a three-point bending test using atomic force microscopy (AFM). FIG. 6 is a SEM image of a nanofiber 30 across a 5 micron trench 32 etched into a silicon substrate 34, such as were used in the test. FIG. 7 presents a schematic drawing of the test, in which the nanofiber 30 was deflected using the AFM tip 36. The tip 36 was used to apply a force at the midpoint 38 of the suspended nanofiber 30. The AFM was operated in contact mode, and a force plot was obtained to determine the displacement of the suspended nanofiber and the applied force. The Young's modulus of the nanofiber was calculated to be 42.99 GPa.

Figure 8:
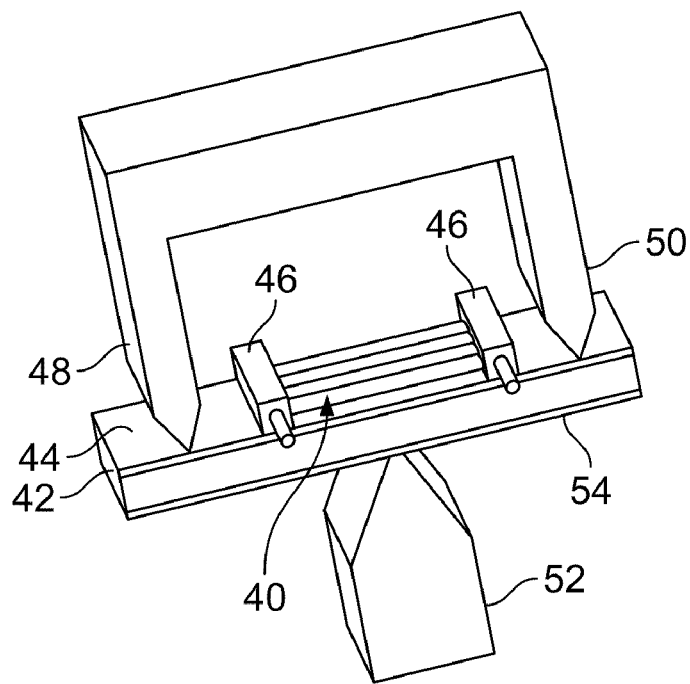
FIG. 8 is a schematic diagram of a three-point bending test performed on a collection of annealed PZT nanofibers using a dynamic mechanical analyzer (DMA).
Figure 9:
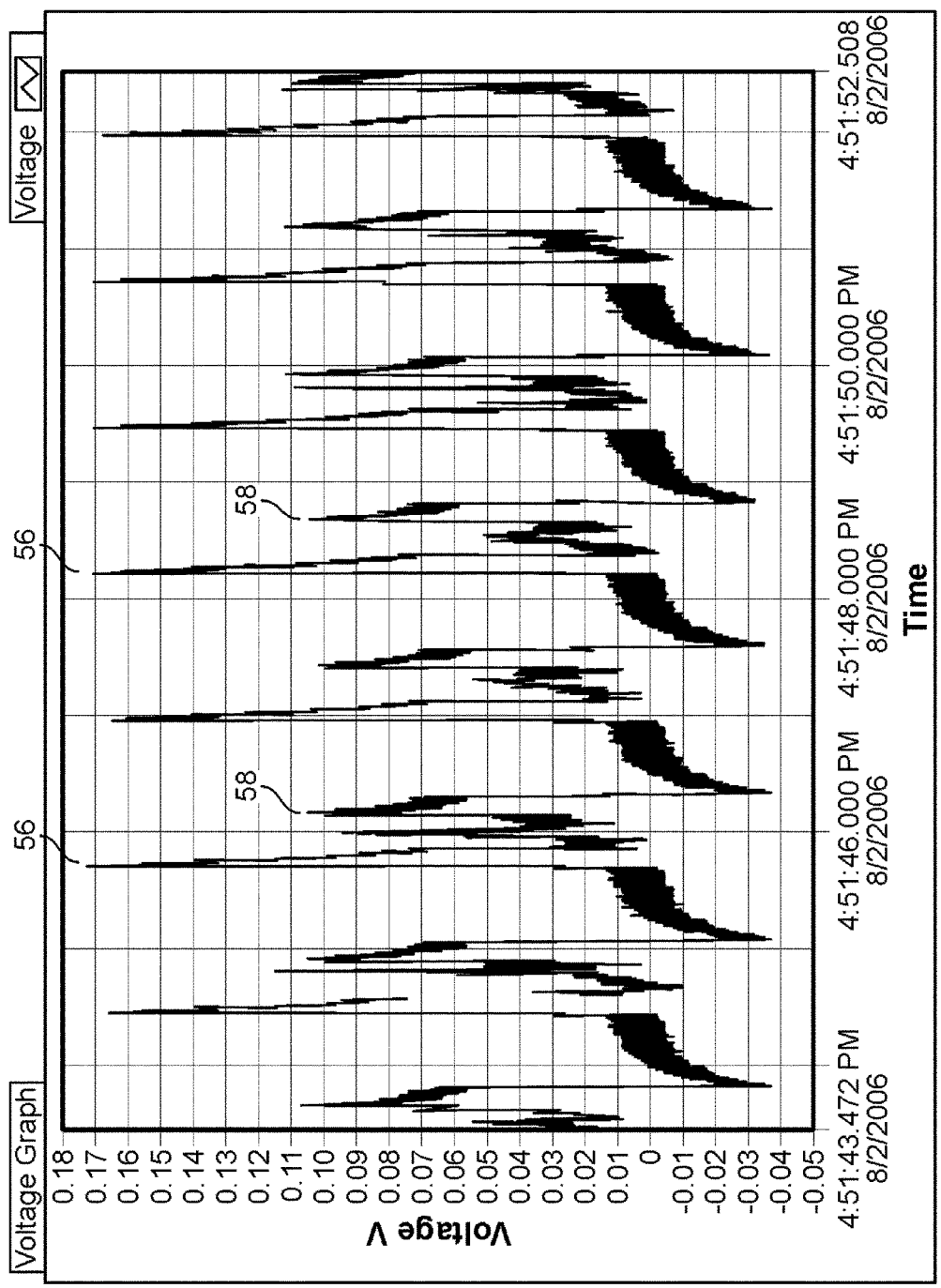
FIG. 9 is a reproduction of a screen-capture of the graphical output obtained during the test of FIG. 8.

Piezoelectric properties: The piezoelectric response of the nanofibers to strains in the transverse direction was evaluated using a three-point bending test similar to that described above. FIG. 8 presents a schematic of the test. Aligned nanofibers 40 were collected on a substrate comprising a titanium (Ti) strip 42 with a layer of zirconium oxide 44 ($ZrO_2$) as an insulator. Conductive adhesive was used to attach the nanofibers to the substrate and also as a pair of electrodes 46. The distance between the electrodes 46 was 1 mm. The three-point bending test was conducted using a dynamic mechanical analyzer (DMA) comprising two fixed points 48, 50 in contact with the insulator 44 and a block 52 to provide pressure to the opposite side 54 of the substrate 42. Different strains were applied to the substrate and the changes in voltage across the electrodes were measured. A voltage of about 0.17 V was generated by applying 0.5% strain on the substrate. The piezoelectric coefficient, $g_{33}$, was calculated to be 0.079 V·m/N. FIG. 9 is a reproduction of a screen-capture from a graphical display of the voltage changes measured during the test. The higher peaks 56 of the graph correspond to the application of the strain, while the smaller peaks 58 correspond to the vibration of the substrate when the strain was released.

Multi-Needle Device for Electrospinning Nanofibers

Figure 10:
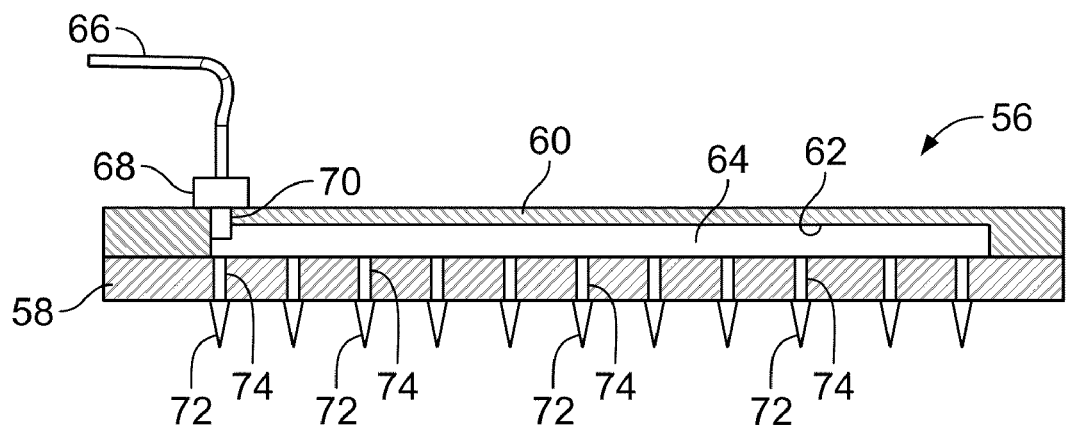
FIG. 10 is a schematic drawing of a multi-needle device for high-rate fabrication of multiple homogenous nanofibers.

The single needle electrospinning process discussed above is not efficient in fabricating large numbers of nanofibers. FIG. 10 illustrates a multi-needle spinning device 56 that has been designed for high rate fabrication of nanofibers.

Referring to the cross-section of the device 56 shown in FIG. 10, the device 56 comprises an element 58 having a low electrical resistance, such as a wafer of doped silicon or a metal plate, and a dielectric element 60 that is joined to the low-resistance element 58. The dielectric element has a concave recess 62 that faces the low-resistance element 58 so as to form a chamber 64. The chamber 64 is hydraulically connected to a high-pressure pump (not shown) through tube 66 by means of fitting 68, which communicates with chamber 64 through port 70. The low-resistance element 58 has a number of hollow needles 72, each having a low electrical resistance, that penetrate the low-resistance element 58 through holes 74 so that they are hydraulically connected to the chamber 64.

The device is intended to replace the needle 12 of the electrospinning apparatus 10 illustrated by FIG. 1. Referring again to FIG. 10, a feeding system (not shown) comprising a syringe and a high-pressure pump would be provided to continuously supply the precursor mixture to all of the needles 72 through the chamber 64. A high voltage would be applied across the low-resistance element and a collecting substrate (not shown), causing nanofibers to be spun from all needles 72 simultaneously.

Figure 11A:
FIGS. 11a-11h are schematic drawings representing steps in a process for fabricating the device of FIG. 10.
Figure 11E:
Figure 11B:
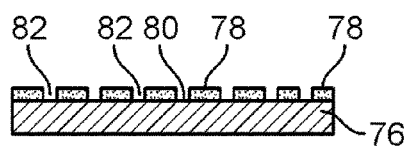
Figure 11F:
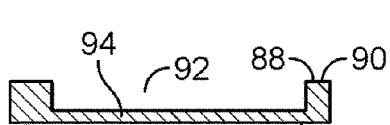
Figure 11C:
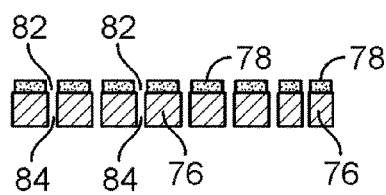
Figure 11G:
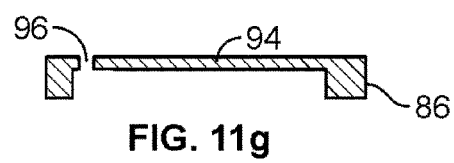
Figure 11D:
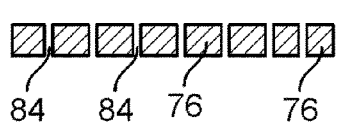

A fabrication process for the multi-needle device is illustrated in cross-section in FIGS. 11a-11h. A low-resistance wafer or plate (subsequently, "the low-resistance wafer" 76), corresponding to low-resistance element 58 of FIG. 10, is provided (FIG. 11a), and a silicon-dioxide mask 78 is laid on its surface 80 (FIG. 11b). Openings 82 in the mask correspond to the outer diameters and desired locations of the holes 84 corresponding to holes 74 in the completed device 56 (see FIG. 10). Referring again to FIGS. 11a-11h, the low-resistance wafer 76 is then etched by deep reactive ion etching (RIE) to create holes 84 that penetrate through it in the positions of the openings 82 in the silicon dioxide mask 78 (FIG. 11c). The mask 78 is then removed from the low-resistance wafer 76 by buffered-oxide etching (BOE) (FIG. 11d).

Figure 11H:
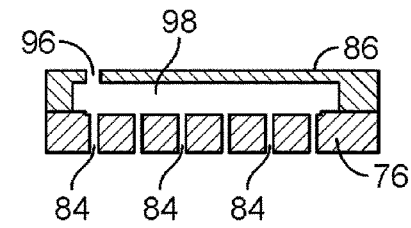

A dielectric wafer (subsequently, "the dielectric wafer" 86) is provided (FIG. 11e) and a silicon dioxide mask (not shown) is laid on its surface 88 to protect an area 90 (shown in cross-sectional side view), extending along its perimeter. A concave recess 92 is then etched into the dielectric wafer 86 by RIE, but not through the wafer 86, so as to leave a thickness 94 of the wafer 86 intact (FIG. 11f). A port 96 is then etched through the remaining thickness 94 of the dielectric wafer 86 to receive a fitting (not shown) that will provide a hydraulic connection between the recess 92 and a high-pressure pump (not shown) (FIG. 11g). The dielectric wafer 86 is then wafer-bonded to the low-resistance wafer 76 with the recess 92 facing the low-resistance wafer 76 so as to form a cavity 98 (FIG. 11h). Needles (not shown), corresponding to needles 72 of FIG. 10, are then fitted to the low-resistance wafer 76 through holes 84, and a fitting (not shown) corresponding to fitting 68 of FIG. 10 is inserted into the dielectric wafer 86 through port 96 to produce a device such as device 56 shown in FIG. 10.

Core-Shell Composite Nanofibers

Core-shell type composite nanofibers or nanotubes, comprising discrete layers of piezoelectric materials and electrically-conductive materials, may be formed by electrospinning or by templating methods. Structures of composite nanofibers may include, for example, those in which a solid fiber of an electrically-conductive material is provided with an outer layer of a piezoelectric material, or in which a layer of electrically conductive material overlies a layer of piezoelectric material, which may also overlie an electrically-conductive core. Structures of composite nanofibers may include, for example, those in which a tube of piezoelectric material has an inner layer of an electrically-conductive material, or both inner and outer layers of an electrically-conductive material. Such composite nanofibers or nanotubes may be used in place of homogenous nanofibers in the applications discussed above, and, because of their electrically-conductive properties, may eliminate the need for the interdigitated electrodes used in active fiber composites (AFC), which are discussed separately.

The piezoelectric material discussed herein is PZT, but other piezoelectric materials, such as ZnO, $BaTO_3$, or a piezoelectric polymer like PVDF, may be used. The electrically-conductive material discussed herein is indium titanium oxide (ITO), but other electrically-conductive materials, such as other electrically-conductive metallic compounds (e.g., cadmium sulfide (CdS)), noble metals (e.g., gold or platinum), or electrically-conductive polymers, may be used.

Fabrication of Composite Nanofibers by Electrospinning

Electrospinning can be used to fabricate core-shell composite nanofibers using any piezoelectric and electrically-conductive materials that can be prepared in sol-gel forms or nanoparticle colloid forms. The electrospinning methods used to prepare composite nanofibers are similar to those described above with respect to fabrication of homogenous nanofibers, except as modified to use two precursor mixtures, rather than one. Further, piezoelectric nanotubes without electrically-conductive layers (i.e., homogeneous nanotubes) may also be made using a further modification of the method described herein.

Figure 12:
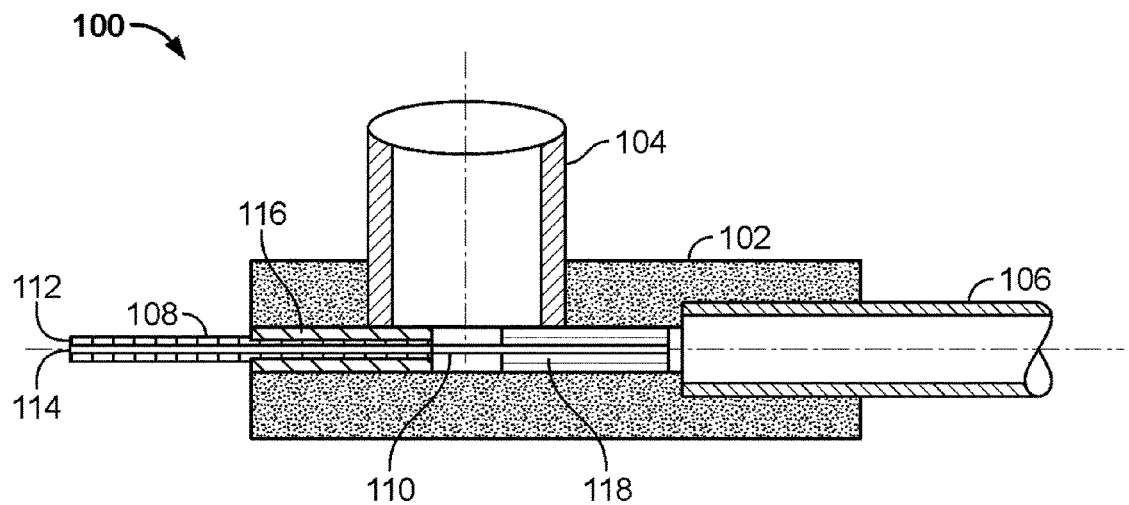
FIG. 12 is a schematic drawing of a coaxial electrospinning device for fabrication of core-shell nanofibers.

FIG. 12 is a schematic drawing of a coaxial electrospinning device 100 for the fabrication of core-shell nanofibers, such as those described above. The device 100 comprises a tube housing 102 for receiving first and second Teflon® tubes 104, 106, which are hydraulically connected, respectively, to first and second syringes (not shown). A stainless steel tube 108 is hydraulically connected to the first syringe through first tube 104. A fused silica tube 110 is situated concentrically within stainless steel tube 108, and is sized so that there is a concentric gap (not shown) between stainless steel tube 108 and fused silica tube 110. The fused silica tube 110 is hydraulically connected to the second syringe through second tube 106. The stainless steel tube 108 and fused silica tube 110 have respective open tips 112, 114 outside of the tube housing 102. In one embodiment of the device 100, the stainless steel tube 108 has an inner diameter of 460 microns and the fused silica tube 110 has an outer diameter of 360 microns and an inner diameter of 75 microns. A first Teflon® sleeve 116 holds stainless steel tube 108 in place and acts as a seal between the stainless steel tube 108 and the tube housing 102. A second Teflon® seal 118 holds fused silica tube 110 in place and acts as a seal between first tube 104 and second tube 106. Persons skilled in the relevant arts will recognize that materials other than stainless steel and fused silica may be used for tubes 108, 110, and that materials other than Teflon® may be used for the other tubes 104, 106 and seals 116, 118. Persons skilled in the relevant arts will also recognize that the design of the device 100 can be modified to accommodate three or more syringes.

In one embodiment of the electrospinning process, the first syringe is filled with a PZT precursor mixture and the second syringe is filled with an ITO precursor mixture. It will be recognized from the configuration of the device 100 shown in FIG. 12 that the contents of the first syringe will be extruded through the gap between stainless steel tube 108 and fused silica tube 110 to form an outer layer of the nanofiber, and that the contents of the second syringe will be extruded through the open tip 114 of fused silica tube 110, to form an inner core of the nanofiber. It will be further recognized that providing a PZT precursor material through first tube 104 without providing any material through second tube 106 will result in the fabrication of a PZT nanotube.

The electrospinning apparatus for producing core-shell nanofibers may be configured according to the schematic in FIG. 1, with the device 100 of FIG. 12 replacing needle 12 of FIG. 1. Further, separate high-pressure pumps (not shown) should be provided to apply pressure to the respective syringes and maintain a continuous flow of the precursor materials to tips 112 and 114. In other respects, the electrospinning process for producing core-shell nanofibers may be the same as the process previously described for producing homogenous nanofibers. The annealing and release processes may also be the same as described for the fabrication of homogenous nanofibers. If a third, outer layer of material is desired, it may be applied by coating, chemical vapor deposition, or other known processes suitable for the material to be used, or it may be co-extruded through a tip adapted from that illustrated in FIG. 12.

Fabrication of Composite Nanofibers and Composite or Homogenous Nanotubes by Template-Assisted Processes Composite nanofibers and nanotubes may be produced by depositing layers of precursor mixtures for piezoelectric materials and precursors for electrically-conductive materials within the pores of a dielectric template and annealing the nanofibers or nanotubes within the template. Homogeneous nanotubes may also be prepared by a similar deposition method, where all of the deposited layers comprise a precursor mixture for a piezoelectric material. Template-assisted methods can be used to fabricate nanofibers and nanotubes, or other nanoscale piezoelectric structures, such as those discussed elsewhere in this specification, using any pairs of piezoelectric and electrically-conductive materials which can be prepared as solutions, sol-gels or nanoparticle colloids, or as vapors such as those used in chemical vapor deposition. Further, although the exemplary methods discussed herein use anodic aluminum oxides (AAO), persons skilled in the relevant arts will recognize that other materials, including other ceramic materials or silicon, can be used to form useful templates.

FIGS. 13a-13c illustrate a generalized procedure for template-assisted formation of composite, nanofibers or composite or hetrogeneous nanotubes. First, an appropriate template 120 is selected that has pores 122 having sizes commensurate with the desired outer diameter of the nanostructure to be fabricated. These pores 122 will extend through the entire thickness of the template 120. AAO templates having substantially-aligned pores of known sizes can prepared on aluminum foil by known methods using the foil as a support layer for the template. Suitable template materials are also available from commercial sources, or templates having desired thicknesses, pore diameters and pore structures may be custom-made. In the example shown in FIG. 13a, precursor for a piezoelectric material, in liquid or vapor form, is deposited, coated or grown on the interior surfaces of the pore 122 to form a shell layer 124. In a variation of the general process, a precursor for an electrically-conductive material may be used in place of the precursor for the piezoelectric material. The thickness of the shell 124 can be controlled by progressively adding layers of the desired material.

Turning to FIG. 13b, when a shell having the desired thickness has been formed, a second shell 126, or a core (not shown), of a precursor mixture for a second material can be formed on the interior of the first shell 124 by adding layers of the appropriate precursor until a second shell 126 of a desired thickness, or a core, has been formed. This process can be adapted to produce at least a third shell (not shown), if desired. The resulting nanostructure is then annealed to produce nanofibers or nanotubes having the desired piezoelectric and conductive properties. Turning to FIG. 13c, the template may then be etched away to recover the nanofibers or nanotubes (e.g., composite nanotube 128). Because the pores in the templates will be substantially aligned, the recovered nanostructures will also be substantially aligned.

Fabrication and Testing of PZT Nanotubes

In an example of the generalized procedure described above with respect to FIGS. 13a-13c, nanotubes comprising a shell of PZT were formed in the pores of an AAO template using a vacuum-assisted deposition process. FIG. 14 is a schematic illustration of the set-up for the vacuum-assisted deposition process. An AAO template, 130, having pores 132, was placed on a filter holder 134 connected to a vacuum pump (not shown) by a tube 136. A PZT precursor mixture 138 was then placed on the template 130, and the vacuum pump was allowed to run until about half of the precursor mixture 138 had been pulled into the pores 132. Excess precursor mixture 138 was removed from the outside of the template 130 using acetic acid, and the template 130, with precursor mixture 138 within its pores 132, was dried at 80° C. to remove solvent and solidify the precursor mixture 138 to form nanotubes (not shown). The nanotubes were then annealed by heating at 380° C. for 5 minutes, then at 650° C. for 1 hour to create a pure perovskite phase of the PZT.

Figure 15:
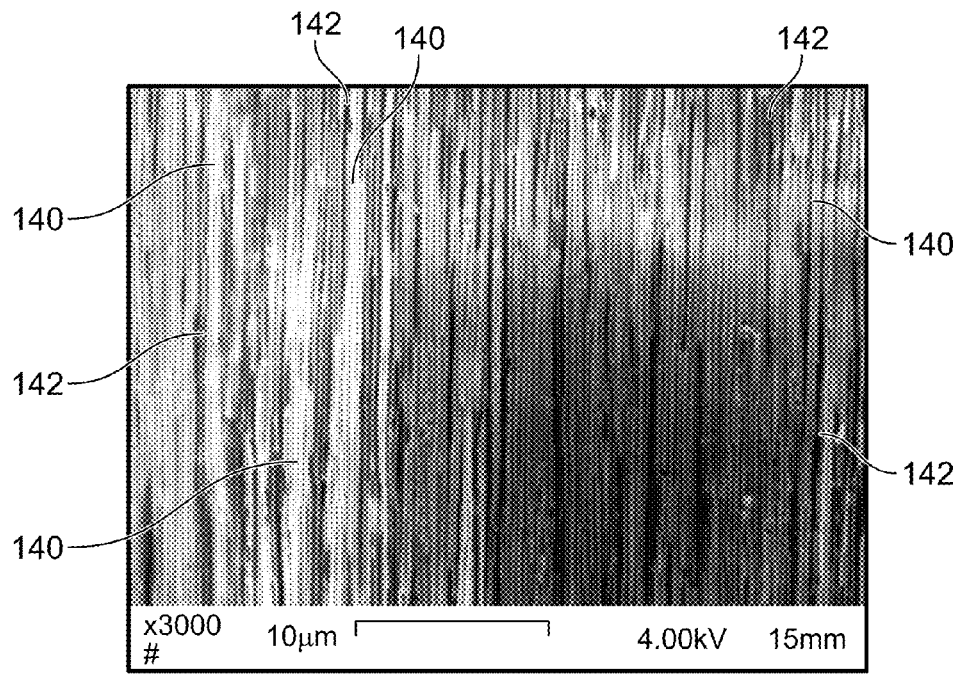
FIG. 15 is a SEM image of a cross-section of an anodic aluminum oxide template having PZT nanotubes within its pores.
Figure 16:
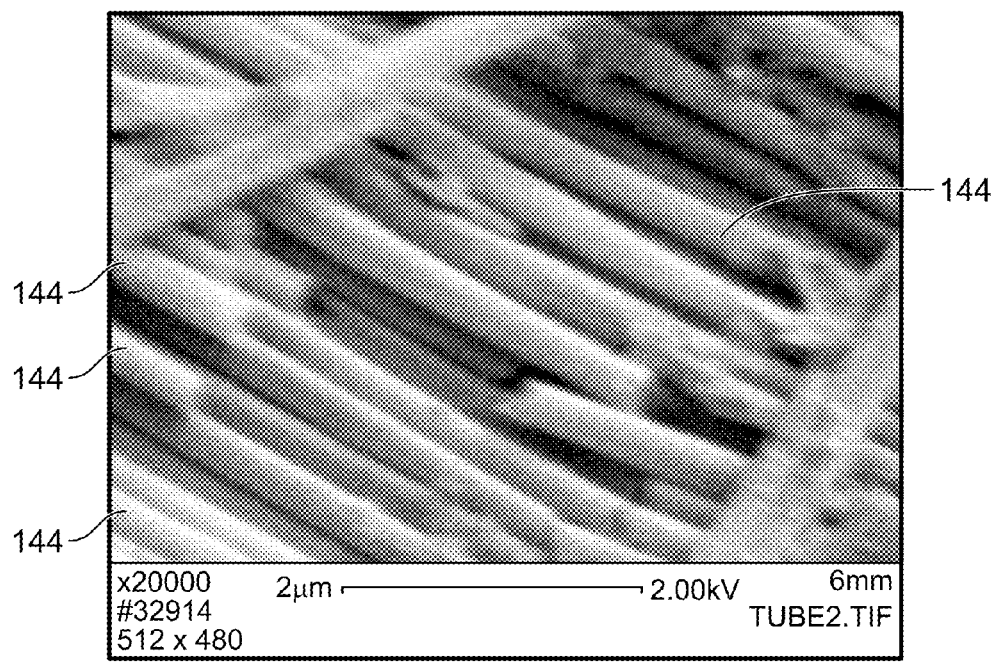
FIG. 16 is a SEM image of a collection of annealed PZT nanotubes that have been recovered from their template.
Figure 17:
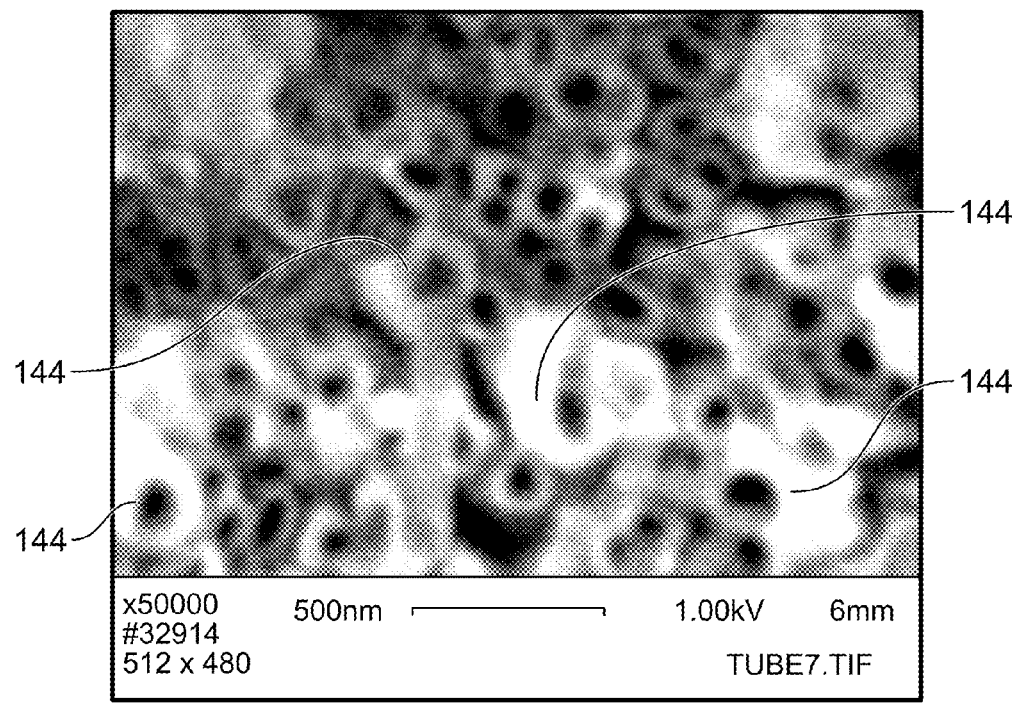
FIG. 17 is a SEM image of a transverse cross-section of the PZT nanotubes of FIG. 16.

Characterization of PZT nanotubes: Nanotubes fabricated as described above were characterized by scanning electron microscopy (SEM), transmission electron microscopy (TEM) and X-ray diffraction. FIG. 15 is a SEM image of a cross-section of an AAO template 140 before the nanotubes 142 are collected. It can be seen that the nanotubes 142 (dark strips) are substantially aligned. FIG. 16 is a SEM image of a collection of substantially-aligned PZT nanotubes 144 that have been recovered from the MO template (not shown) in which they were formed. These tubes have diameters of about 190 nm to 210 nm and wall thicknesses of about 20 nm. They were formed with five layers, by consecutive deposition steps. FIG. 17 is an end-view of the PZT nanotubes 144 of FIG. 16. The templates used to form the nanotubes 144 were nominally 60 microns thick, resulting in nanotubes that were nominally 60 microns long.

Figure 18:
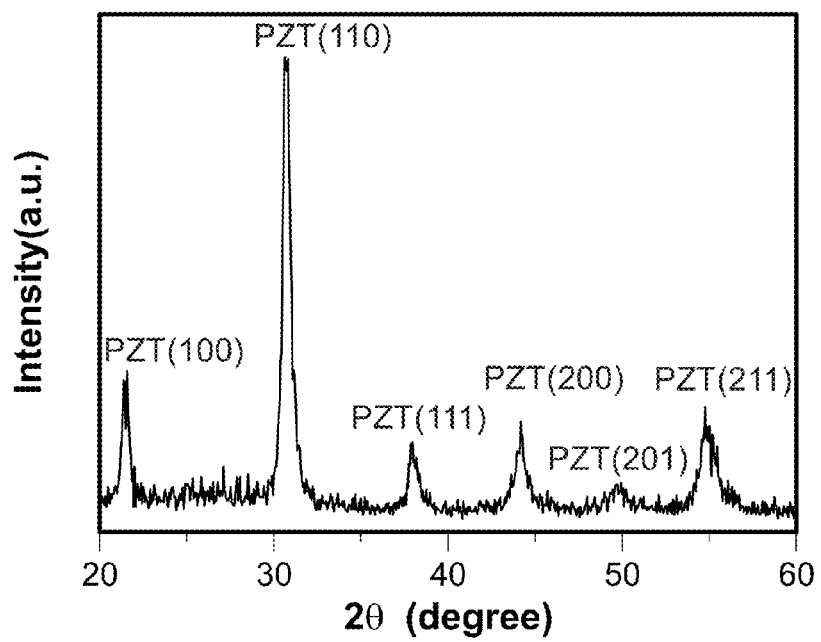
FIG. 18 is an x-ray diffraction pattern of a PZT nanofiber of FIGS. 16 and 17.

FIG. 18 shows the x-ray diffraction pattern of the annealed PZT nanotubes 144. The pattern indicates that the nanotubes 144 have a pure perovskite crystalline phase, which provides the piezoelectric properties of the nanotubes 144.

Electromechanical coupling tests: Nugget drop tests were conducted on PZT nanotubes within an AAO template to demonstrate the piezoelectric properties of the nanotubes. AFM and DMA tests, similar to those discussed above with respect to PZT nanofibers, can also be performed on PZT nanotubes with little to no modification of the procedures previously discussed. Other tests typically used to evaluate mechanical and piezoelectric properties of materials, such as dynamic vibration tests, may also be performed.

Figure 19:
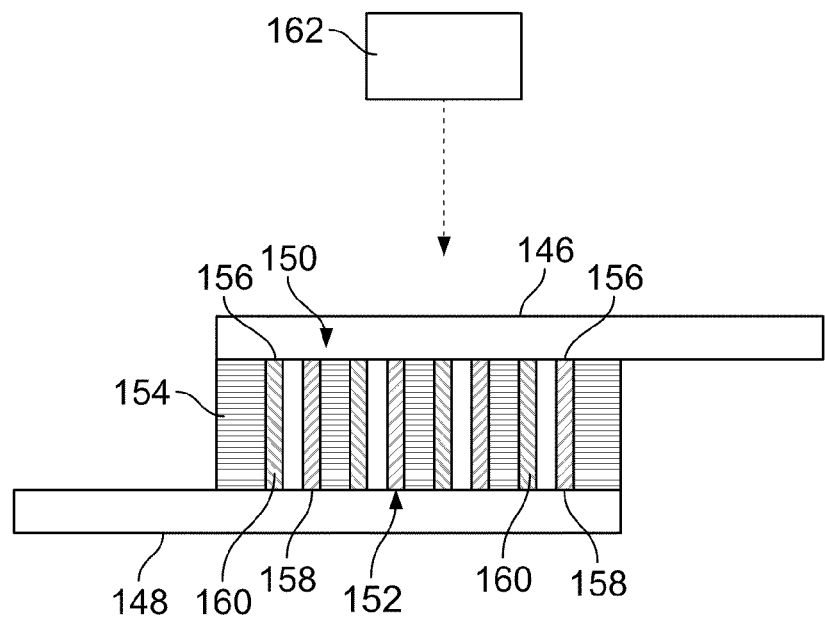
FIG. 19 is a schematic drawing of a nugget drop test performed on nanotubes within their template.

FIG. 19 is a schematic illustration of the nugget drop test. Upper and lower electrodes 146, 148 were formed on the opposite faces 150, 152 of the AAO template 154 using a conventional technique, so as to contact the ends 156, 158 of the nanotubes 160 within the template. Nuggets 162 were dropped from different heights onto the upper electrode 146. The impact force of the nugget 162 onto the electrode 146 was transferred to the nanotubes 160, resulting in their deformation and an accumulation of charge upon them.

Figure 20:
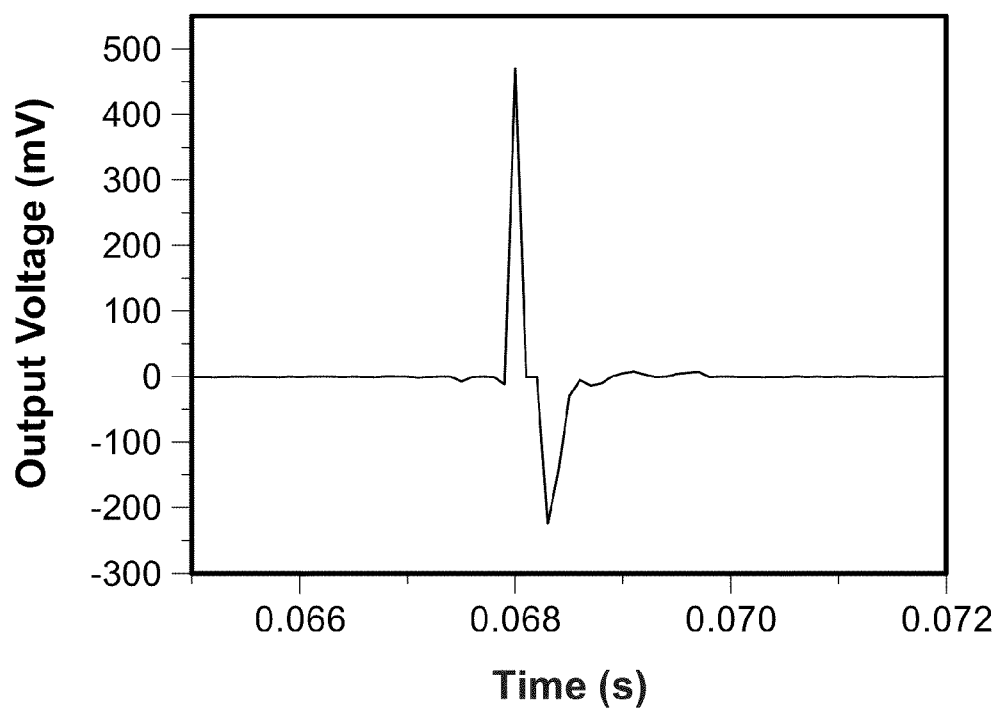
FIG. 20 is a graph of the voltage measured across a group of nanotubes during the test of FIG. 19.

FIG. 20 is a graph of the voltage measured during a typical drop. As can be seen, the impact of the nugget causes a sudden spike in the voltage measured across the template. A sudden reversal of voltage also occurs immediately after the spike, probably resulting from rebound of the deformed material.

Figure 21:
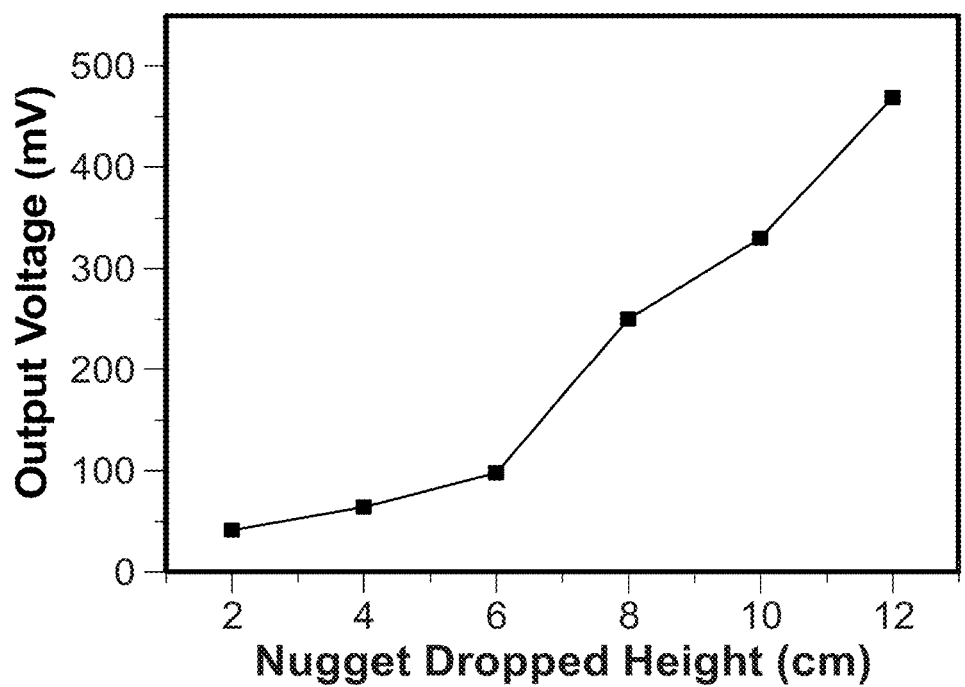
FIG. 21 is graph of the voltages measured across a group of nanotubes during a series of nugget drop tests.

FIG. 21 is a graph of the measured voltage as a function of the height from which the nugget was dropped. The measured voltage increases in a roughly linear relationship with the drop height.

Branched Piezoelectric Structures

Figure 22:
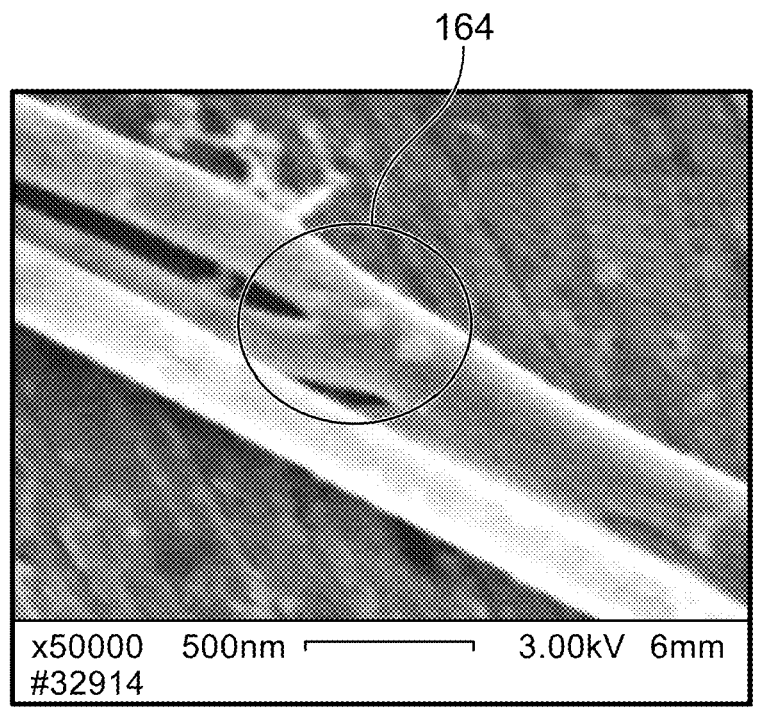
FIG. 22 is a SEM image of a simple Y-branched piezoelectric nanostructure.
Figure 23:
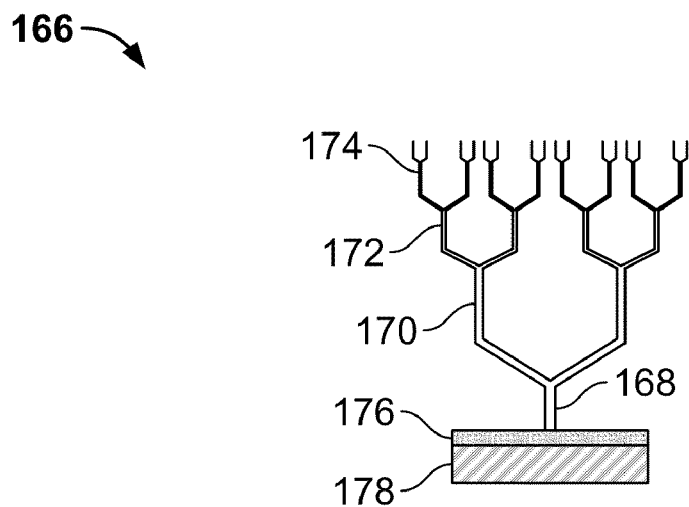
FIG. 23 is a schematic drawing of a highly-branched piezoelectric nanostructure.

FIG. 22 is a SEM image of a simple Y-branched piezoelectric structure 164 ("nanojunction") in a nanofiber formed by a template-assisted method. Such structures 164 occur when the pores in the template are themselves branched. Branched pores are often unintended artifacts of the template formation process. However, branched pores, including highly-branched pores, can intentionally be formed in templates by a controlled process described herein, and used to form highly-branched piezoelectric nanostructures ("nanotrees"). An example of such a nanotree 166 is illustrated schematically in FIG. 23. As can be seen, a nanotree has a primary stem 168 and one or more generations of branches 170, 172 174 connected to the stem 168. The nanotree 166 may be attached through its stem 168 to an insulating oxide layer 176 or other substrate 178. Such nanotrees may be fabricated with layers of piezoelectric and electrically-conductive materials, or may be homogenously formed from a piezoelectric material.

Figure 24:
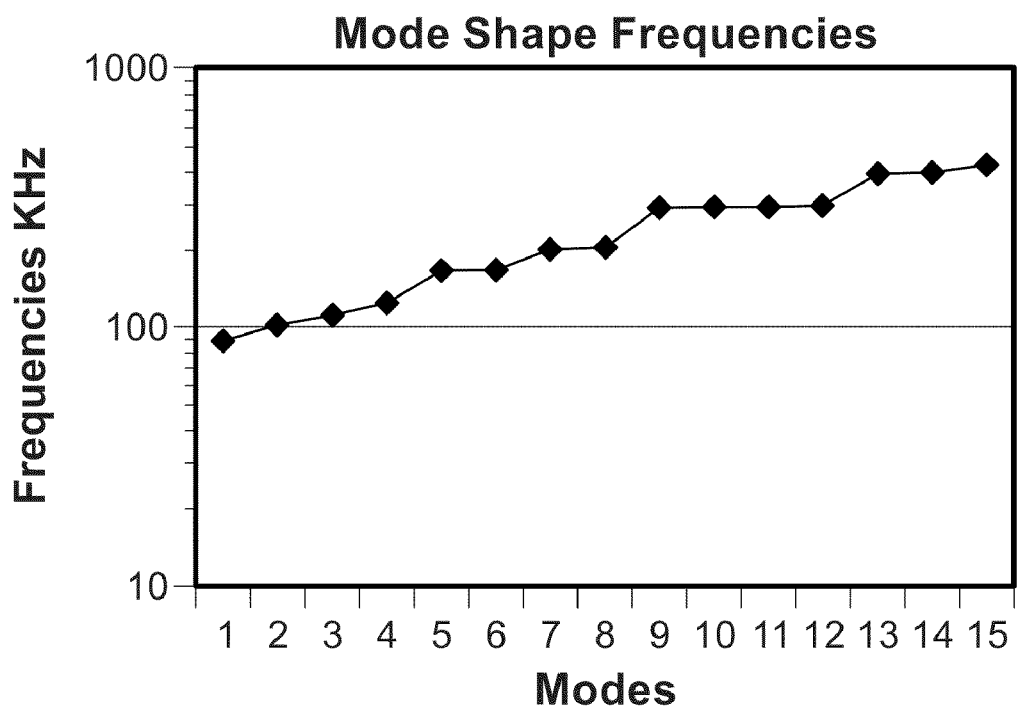
FIG. 24 is a graph of resonant frequencies modeled for the vibrational modes of a highly-branched piezoelectric nanostructure.

Because of their highly-branched structures, piezoelectric nanotrees, such as nanotree 166, have potential applications in energy scavenging or as high-frequency wide-band energy filters. In general, a piezoelectric structure can convert mechanical vibrational energy into electrical energy, with the conversion efficiency peaking at the structure's resonant frequency. Finite element analysis of a nanotree structure showed that it has a number of complex vibrational modes, resulting in a series of closely-spaced resonant frequencies (FIG. 24). As a result, a nanotree structure can be used to scavenge energy from a wide range of ambient mechanical vibrations having the same frequencies. A nanotree structure can also be used as a high-frequency wide-band energy filter that passes signals at frequencies other than its resonant frequencies. Because a nanotree structure has numerous closely-spaced resonant frequencies, the filter is "wide-band" in nature.

Fabrication of Templates Having Highly-Branched Pores

The fabrication of templates having highly-branched pores is discussed herein with respect to AAO templates. Methods for fabricating such templates from other materials, such as other ceramic materials, will be recognized by persons having skill in the relevant arts.

Typically, a porous AAO template may be formed by an electrolytic process wherein a direct current is passed through an acidic electrolyte, using an aluminum foil as the anode on which the AAO is formed. Pore size is controlled by balancing the rate at which AAO is formed with the rate at which it is etched by the acid.

Figure 25:
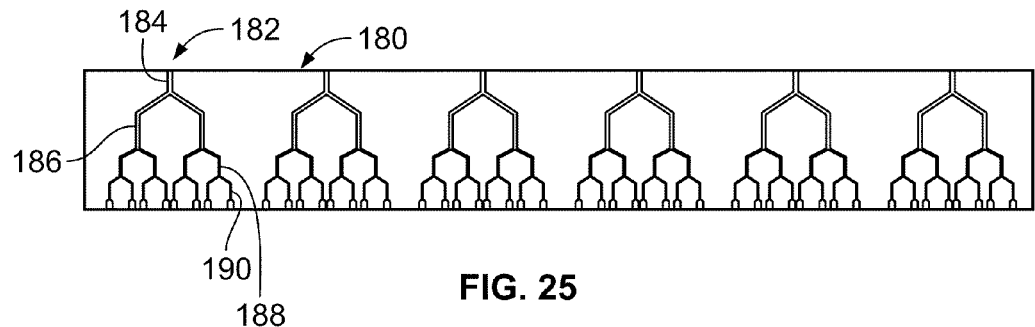
FIG. 25 is a schematic drawing of a template for the fabrication of highly-branched piezoelectric nanostructure.

FIG. 25 is a schematic representation of an AAO template 180 having highly-branched pores 182 for fabricating piezoelectric nanotrees. In a method for fabricating templates, such as template 180, the anodization process is started according to the typical method for producing AAO templates having pores without branches. When primary pores 184 have formed, the anodizing voltage will be reduced to $(1/2)^{1/2}$ of its initial value causing the primary pore 184 to branch in a Y-formation, forming secondary pores 186. Additional generations of Y-branched pores 188, 190 can be formed by further sequential reduction of the anodizing voltage. In fact, highly-branched pore structures can be obtained by adjusting the anodizing voltage to $(1/n)^{1/2}$ of its initial value, where n is the number of generations of pores. For example, branches 190 would represent the fourth generation of pores, and would be formed by adjusting the anodizing voltage to $(1/4)^{1/4}$ of its initial value.

Fabrication of Composite or Homogeneous Nanotrees

Composite nanotrees may be produced using adaptations of the template-assisted methods discussed with respect to composite or homogenous nanofibers and nanotubes. That is, composite nanotrees may be formed in templates having highly-branched pores by forming layers of precursor mixtures for piezoelectric materials and precursor mixtures for electrically-conductive materials within the pores and annealing the nanotrees within the template. Homogeneous nanotrees may also be prepared by a similar layer formation process, wherein all of the deposited layers comprise a precursor mixture for a piezoelectric material. Composite nanotrees can be fabricated from any pairs of piezoelectric and electrically-conductive materials which can be prepared as solutions, sol-gels, or nanoparticle colloids, or as vapors, such as those used in chemical vapor deposition.

Characterization and Testing of Nanotrees

Nanotrees may be characterized and tested by the same methods used to characterize and test nanofibers or nanotubes. For example, nanotrees may be characterized using SEM, TEM and X-ray diffraction. Mechanical and electromechanical coupling tests that may be used include AFM and DMA tests, dynamic vibration tests, and nugget drop tests.

Nanoscale Active Fiber Composites (NAFC)

Figure 26:
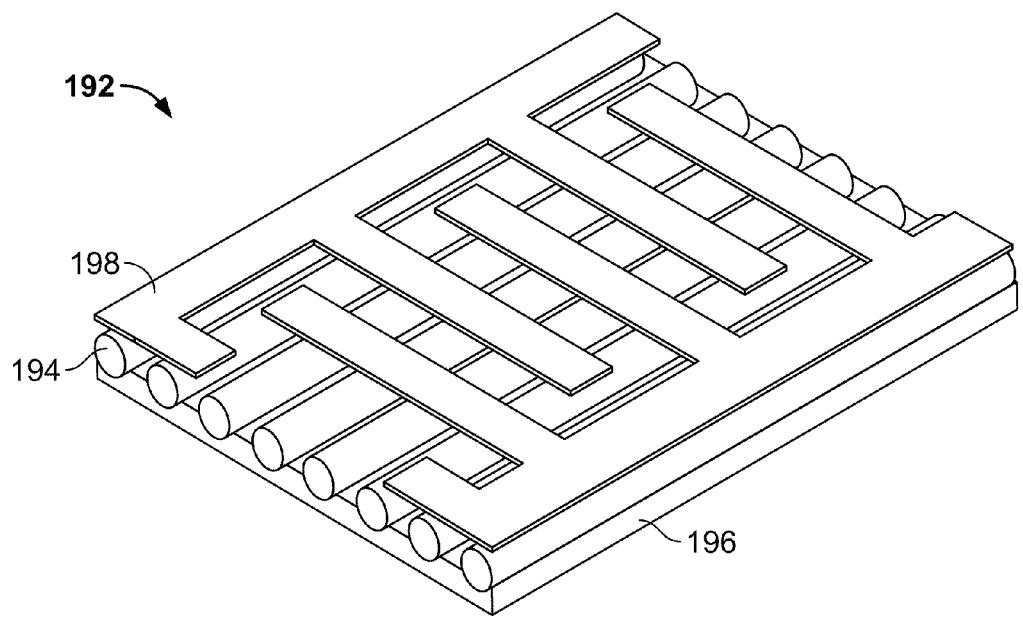
FIG. 26 is a schematic drawing of a conventional active fiber composite device.
Figure 27:
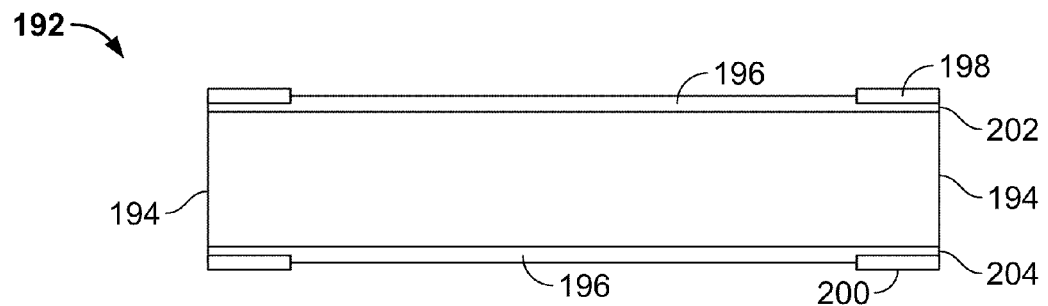
FIG. 27 is a schematic cross-sectional drawing of the active fiber composite device.
Figure 28:
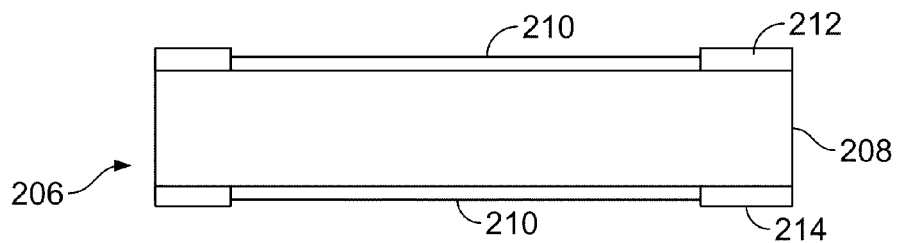
FIG. 28 is a schematic cross-sectional drawing of an active fiber composite device incorporating electrodes in direct contact with piezoelectric nanofibers.

FIGS. 26 and 27 are schematic illustrations, in orthogonal and cross-sectional views, respectively, of a typical design for an active fiber composite (AFC) device 192, wherein piezoelectric fibers 194 are encased in a dielectric matrix 196, such as a resin epoxy, onto which electrodes 198, 200 are deposited. As a result, there are electrically-insulated gaps 202, 204 between the electrodes 198, 200 and the fibers 194. When a voltage is applied across the electrodes 198, 200 of such an AFC device 192, most of the voltage drop will occur across the insulated gap 202, 204, making it necessary to supply a high voltage, sometimes in the thousands of volts, to actuate the AFC device 192. At such voltages, the dielectric matrix 196 may break down, diminishing the efficiency of the AFC device 192. FIG. 28 is a cross-sectional schematic view of a NAFC device 206 fabricated using piezoelectric nanofibers 208. The nanofibers 208 are coated with dielectric matrix material 210, with electrodes 212, 214 deposited directly on the nanofibers 208. Because the electrodes 212, 224 are in direct contact with the nanofibers 208, the NAFC 206 can be actuated at voltages as low as a few volts to a few tens of volts.

Fabrication of NAFC Devices

Figure 29:
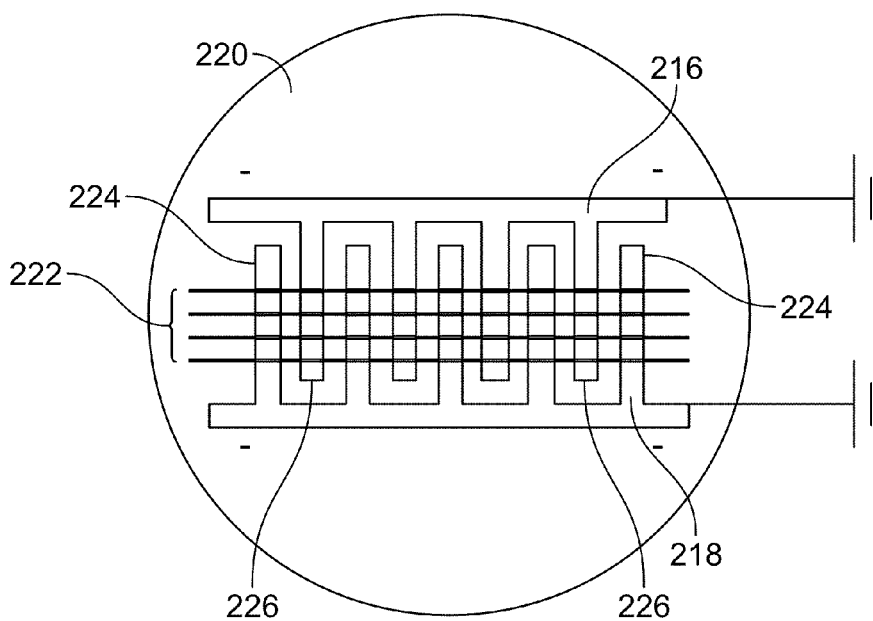
FIG. 29 is a schematic drawing of aligned nanofibers collected on interdigitated electrodes over a dielectric substrate.
Figure 30:
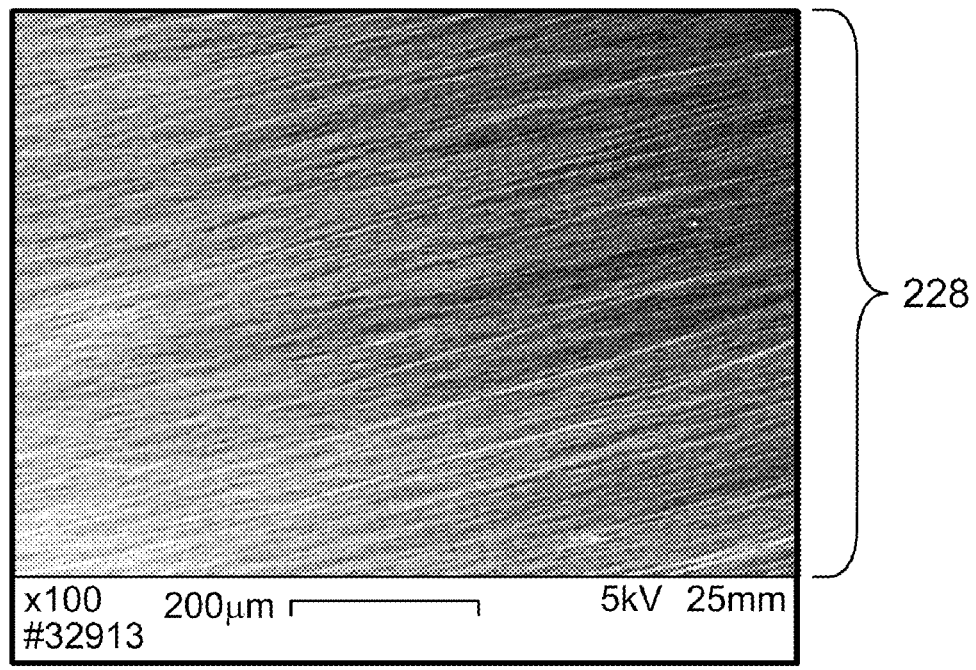
FIG. 30 is a SEM image of aligned nanofibers collected on a substrate.

In a method of fabricating NAFC devices, aligned piezoelectric nanofibers are collected on a substrate during an electrospinning process. As discussed elsewhere with respect to electrospinning, short nanofibers may be collected on dielectric layers over a grounded, uniformly-deposited electrode or doped silicon wafer, or a trench can be made over the electrode, and the short fibers collected across the trench. Referring to FIG. 29, interdigited electrodes 216, 218 can be formed on a silicon wafer 220 and electrically grounded, and long fibers 222 collected across the electrode fingers 224, 226. The alignment of the nanofibers is controlled by the electric field applied to the substrate during the electrospinning process. These methods can be readily adapted for collection of aligned composite nanofibers. A collection of aligned nanofibers 228 is shown in FIG. 30.

After the aligned nanofibers have been collected, electrodes (not shown) may be deposited directly on top of the nanofibers by methods such as sputtering or e-beam deposition. Then a matrix material, such a resin epoxy or silicone in solvent, may be deposited on the electrodes by methods such as spin-coating, and the solvent baked off in a curing process. By adjusting the ratio of solvent to silicone, matrix membranes having thicknesses as small as about 1.0 micron to about 1.2 microns have been obtained.

Testing of NAFC Devices

Figure 31:
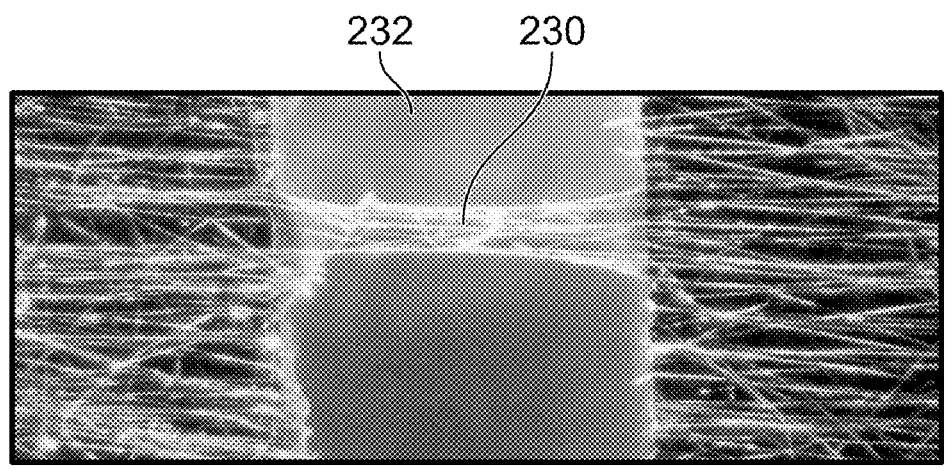
FIG. 31 is a SEM image of a nanofiber active fiber composite beam.

An example of a NAFC beam 230 made by a fabrication process such as that described is shown in FIG. 31. The beam is about 3 to 4 microns wide and extends over a 20 micron trench 232 in a silicon substrate. The ends of the beam are anchored to the substrate.

The mechanical properties of the beam were tested using an AFM method similar to the three-point deflection test discussed above with respect to testing a homogenous nanofiber. The stiffness of the beam was calculated to be 0.148 N/m.

Other methods of testing piezoelectric structures, such as the DMA tests, dynamic vibration tests, and nugget drop tests discussed elsewhere in this specification, may be adapted for testing the properties of NAFC devices. Appropriate adaptations will be recognized by persons skilled in the relevant arts.

It should be understood that the embodiments described herein are merely exemplary and that a person skilled in the art may make many variations and modifications thereto without departing from the spirit and scope of the present invention. All such variations and modifications, including those discussed above, are intended to be included within the scope of the invention, which is described, in part, in the claims presented below.

What is claimed is:

1. An article, comprising a nanoscale piezoelectric structure including a branched structure having a stem with a plurality of branches extending therefrom wherein said stem and at least one of said plurality of branches includes a piezoelectric material.

2. The article of claim 1, wherein said at least one branch of said nanoscale piezoelectric structure further includes a plurality of further branches extending therefrom and at least one of said plurality of further branches includes said piezoelectric material.

3. The article of claim 1, further comprising an electrically-conductive material in contact with said piezoelectric material.

4. The article of claim 3, wherein at least a portion of said electrically-conductive material is inside said nanoscale piezoelectric structure.

5. The article of claim 3, wherein said electrically-conductive material is on an exterior surface of said nanoscale piezoelectric structure.

6. The article of claim 3, wherein said electrically-conductive material includes indium titanium oxide.

7. The article of claim 1, wherein said piezoelectric material includes lead zirconate titanate.

8. The article of claim 1, wherein said nanoscale piezoelectric structure has an exterior surface in electrical communication with an electrode.

9. The article of claim 1, wherein said stem is in contact with an electrical insulator.

10. The article of claim 1, wherein said article further comprises an electrically-insulating matrix deposited on said nanoscale piezoelectric structure.

11. The article of claim 1, wherein said nanoscale piezoelectric structure is formed by a method including the steps of:
providing a template having a branched pore extending therethrough, said template having first and second sides, said branched pore having a stem portion opening at said first side and branch portions extending from said stem portion and opening at said second side, and an interior surface extending along said stem portion and said branch portions;
depositing a precursor material into said branched pore so that said precursor material remains in said branched pore so as to form a branched hollow structure within said branched pore, said precursor material being a material that is transformable to a piezoelectric material upon heating; and
heating said precursor material in said template, whereby said precursor material is transformed into a piezoelectric material.

12. The article of claim 11, wherein said method comprises the further steps of solidifying said precursor material, and depositing a second material onto said precursor material, wherein said second material includes either a material that is electrically-conductive in a solid form or a material that is transformable into a piezoelectric material upon heating.

13. The article of claim 12, wherein said material that is electronically conductive in a solid form includes indium titanium oxide.

14. The article of claim 11, wherein said precursor material includes lead zirconate titanate and said heating step includes the step of maintaining said precursor material at a temperature of about 650° C. until at least a portion of said lead zirconate titanate is transformed into crystals having a perovskite structure.

15. The article of claim 14, wherein said precursor material further includes at least one organic liquid, and said heating step includes the further step of removing substantially all of said at least one organic liquid from said precursor material before said maintaining step.

16. The article of claim 11, wherein said precursor material includes lead zirconate titanate, poly(vinyl pyrrolodine) and an alcohol, and said heating step includes the steps of maintaining said precursor material at about 380° C. for at least 5 minutes, then maintaining said precursor material at a temperature of about 650° C. for at least about one hour.

* * * * *